United States Patent [19]

Savage et al.

[11] Patent Number: 5,239,125

[45] Date of Patent: Aug. 24, 1993

[54] EMI/RFI SHIELD

[75] Inventors: Howard S. Savage, Urbana; Ray G. McCormack, St. Joseph, all of Ill.

[73] Assignee: The United States of America as represented by the Secretary of the Army, Washington, D.C.

[21] Appl. No.: 540,068

[22] Filed: Jun. 19, 1990

[51] Int. Cl.$^5$ .............................................. H05K 9/00
[52] U.S. Cl. ............................. 174/35 MS; 361/816; 250/515.1; 250/517.1; 250/505.1; 174/35 R
[58] Field of Search .......... 174/35 MS, 35 GC, 35 R; 361/424; 219/10.55 R, 10.55 D; 250/505.1, 506.1, 507.1, 515.1, 516.1, 517.1

[56] References Cited

U.S. PATENT DOCUMENTS

| | | | |
|---|---|---|---|
| 3,030,435 | 4/1962 | Andrews | 174/35 MS |
| 3,305,623 | 2/1967 | Bakker et al. | 174/35 MS |
| 4,037,009 | 7/1977 | Severinsen | 428/241 |
| 4,115,656 | 9/1978 | Aitel | 174/35 MS |
| 4,662,967 | 5/1987 | Bogan et al. | 156/242 |

FOREIGN PATENT DOCUMENTS 8605062  8/1986  World Int. Prop. O. .

Primary Examiner—Leo P. Picard
Assistant Examiner—Bot Ledynh
Attorney, Agent, or Firm—Luther A. Marsh

[57] ABSTRACT

An EMI/RFI shield for seams and cracks in surfaces of shielded structures is disclosed. At least one conductive screen is applied in electrical contact with the surfaces and a conductive coating is applied over the screen to physically bond the screen to the surfaces and to maintain electrical conduction.

2 Claims, 2 Drawing Sheets

EMI/RFI SHIELD

STATEMENT OF GOVERNMENT INTEREST

The invention described and claimed herein may be manufactured and used by or for the Government of the United States of America for governmental purposes without the payment of royalties thereon or therefor.

BACKGROUND OF THE INVENTION

The present invention relates to a system for maintaining electrical continuity between adjacent conductive surfaces. In particular, the invention relates to a method and structure for preventing the leakage of electromagnetic waves and radio frequency waves through the junction of adjoining conductive panels wherein the panels are subject to relative movement.

Electronic equipment emits electromagnetic and radio frequency waves which may be detected by or interfere with other equipment. Such interference is commonly known as electromagnetic interface (EMI) and radio frequency interference (RFI). Methods have been developed for either isolating the source of the interference or for shielding other equipment from interfering waves. Ordinarily, equipment to be protected is located in a room or enclosure that is provided with EMI/RFI shielding. Alternatively, the equipment is encased in an EMI/RFI protective housing.

Full-sized rooms designed to shield EMI/RFI have typically been constructed from welded or bolted-together electrically conductive panels of sheet metal. Likewise, the protective housings for equipment have often commonly been formed from metal. The use of metal in this manner to protect equipment is expensive and cumbersome due to the cost and weight of the metal.

Methods have been developed for fabricating a lightweight, relatively inexpensive protective housing for equipment. For example, U.S. Pat. No. 4,678,699 to Kritchevsky et al. discloses a stampable thermoplastic composite having EMI/RFI shielding capabilities. The composite can be shaped into various configurations. The composite has at least one thermoplastic layer and one EMI/RFI shielding layer. The shielding layer is a fibrous or foraminous material such as nickel coated graphite fiber mat, metal fiber mat, knitted metal wire mesh or metal screen or, alternatively, a perforated metal sheet.

In another known method of fabrication, the protective housing is formed from plastic, and a layer of metal is arc-sprayed onto the plastic housing to provide the EMI/RFI protection. This concept of arc-spraying metal onto a surface to provide EMI/RFI shielding has been further extended to full sized rooms as discussed in Technical Report M-316 (U.S. Army Construction Engineering Research Laboratory, June 1982) entitled "Arc-Sprayed Metals for Structural Electromagnetic Shielding" and Technical Report M-332 (U.S. Army Construction Engineering Research Laboratory, August 1983) entitled "Electromagnetic Shielding of Full-Sized Structures By Metal Arc Spraying", both written by Paul Nielsen. These reports disclose studies related to metal arc-spraying of construction materials for EMI/RFI shielding.

A problem associated with both the metal arc-sprayed rooms and EMI/RFI protected rooms made from sheet metal, involves the leakage of electromagnetic and radio frequency waves. With arc-sprayed rooms, the metal lamina may crack due to settling or shifting of the building. The corners of the rooms are especially susceptible to cracking. Electromagnetic waves and radio frequency waves can also leak through the junctions of metal sheets used in forming a room or shelter.

Attempts have been made to provide shielding at the junction of structures where EMI/RFI leakage is likely to occur. U.S. Pat. No. 3,432,609 to W. C. Duvall et al. discloses a prefabricated shelter for shielding personnel and equipment from RFI. Inflatable panels, covered with a radio reflective material such as silver-coated nylon cloth, are interconnected to form the shelter. In order to provide radio reflective continuity between adjacent panels, a flexible metal screen is interposed between the panels so that the edges of the screen are in metal-to-metal contact with the radio reflective layer of the panels.

U.S. Pat. No. 4,655,012 to Downey et al. discloses a system for joining adjacent RFI protected buildings in a weather proof and RFI proof arrangement, wherein the buildings are subject to shifting relative to one another. A wire screen is shaped into a continuous loop much like a wire tube. The length of the wire tube is approximately equal to the distance between the buildings. In position, the ends of the wire tube are brought into electrical engagement with metallic skins already provided on the buildings as RFI shielding.

U.S. Pat. No. 4,115,656 to Aitel discloses a rigid-walled, telescoping passageway for interconnecting adjacent EMI shielded shelters where the shelters may not be in perfect alignment with respect to each other. The passageway comprises two aluminum overlapping sections. One section is telescopically received by the other. EMI shielding in the form of resilient conductive stuffing material or a rolling diaphragm is positioned between the overlapping portions of the passageway sections in order to maintain EMI shielding continuity between the sections. The rolling diaphragm is made from resilient layers of knitted metallic fiber with a resilient layer of electrically insulating material sandwiched between the metallic layers.

SUMMARY OF THE INVENTION

The present invention provides a relatively simple method for shielding junctions and cracks of EMI/RFI protected structures. Alternatively, the method involves maintaining the electrical continuity of an EMI/RFI protected structure in corners, joints, and areas of anticipated cracking or delamination.

Accordingly, a flexible shield in the form of a conductive, resilient, porous screen is positioned across the corner, joint, or anticipated region of cracking in electrical contact with the EMI/RFI shielding layer of the structure. An overcoat of metal is deposited on and through the screen such that the screen is bonded to the underlying surface. In one embodiment the shielding layer may be a conductive base coat of metal deposited on the structure underlying the porous screen. Such a base coat provides an adherent and electrically conductive surface on which to bond the porous screen.

DETAILED DESCRIPTION OF THE PREFERRED EMBODIMENTS

Figure 1:
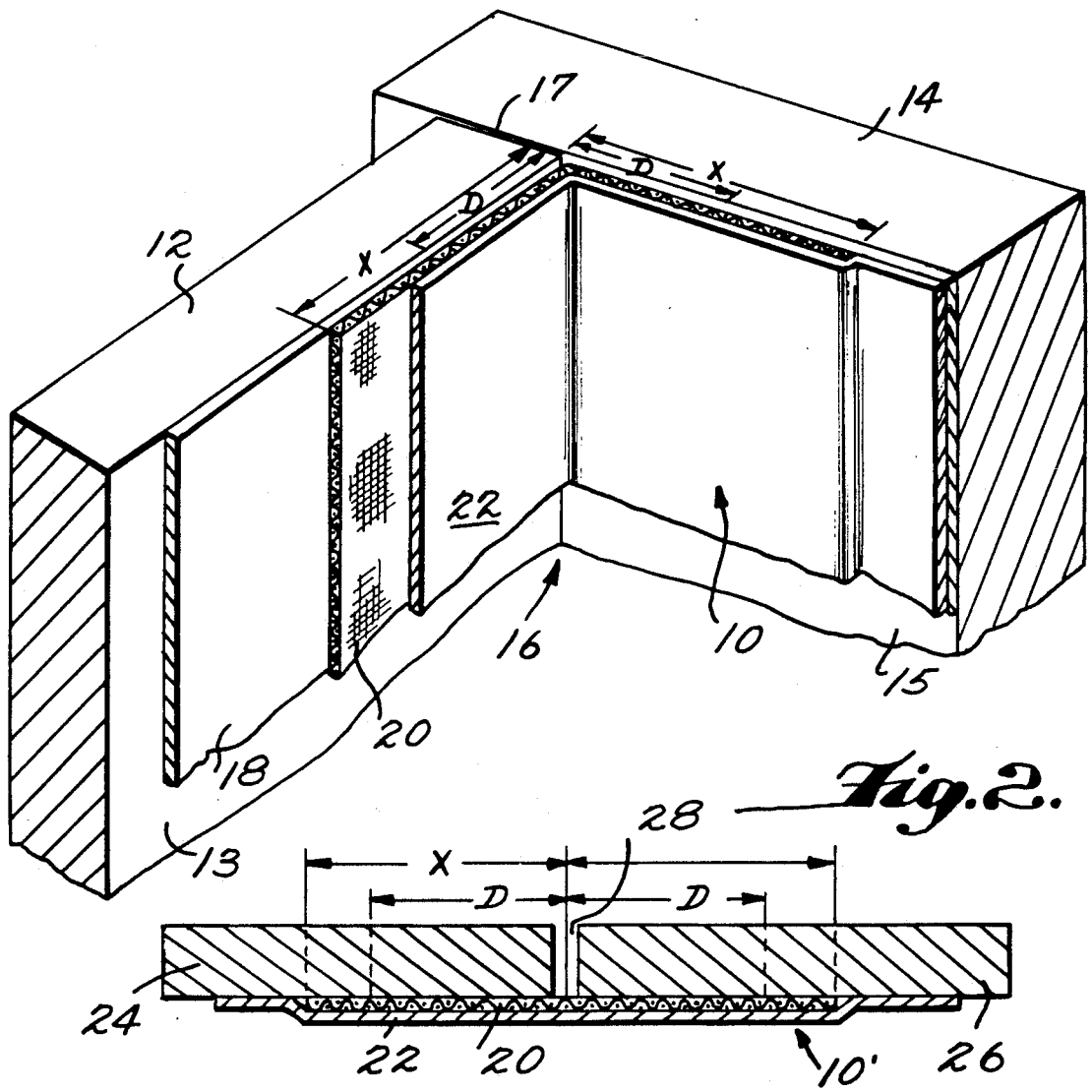
FIG. 1 illustrates a perspective, cut-away view of an embodiment of the invention applied to a corner of a room formed from two adjoining walls.

The present invention relates to a system for maintaining the electrical continuity between adjacent conductive surfaces. In the case where the conductive surfaces are part of a shielded room or enclosure, the present invention comprises an EMI/RFI shield for preventing leakage of electromagnetic waves and radio frequency waves through cracks in the surfaces or through junctions between conductive surfaces. As generally shown in FIG. 1, the shield 10 comprises a conductive mesh 20 or screen of electrically conductive material locatable across the junction 16 between the surfaces 13 and 15 of responsive walls 12 and 14, at least one electrically conductive over coating 22 is deposited in and through the screen 20 for physically bonding the screen 20 to the conductive surfaces 13 and 25 and for maintaining electrically conductivity therebetween. The shield 10 thus applied prevents EMI/RFI leakage in the region of the surfaces susceptible to such leakage. The shield 10 has sufficient tensile strength to withstand tearing and cracking should the adjacent walls 12 and 14 move relative to one another. The mesh 20 conforms to the shape of the structure to which it is applied.

In discussing FIGS. 1–5 below, the preferred embodiments of the invention are described in reference to their application to a room where EMI/RFI shielding is desired. The present invention, however, can be applied to a variety of structures of different size and shape for the purpose of providing electrical continuity between adjacent structures or for the additional purpose of EMI/RFI shielding.

FIG. 1 illustrates a fragmentary perspective view of the shield 10 according to the invention applied to the corner seam 16 of a room having adjoining walls 12 and 14. The walls 12 and 14 provide EMI/RFI shielding either by the inherent nature of the composition of the walls 12 and 14 (e.g. metal walls) or by the application (e.g. by arc-spraying) of an EMI/RFI shield coating not shown. The shield 10 is applied to the corner 16 by depositing a base coating 18 of conductive material on the surfaces 13 and 15 of the walls 12 and 14 and across the corner seam 16. The base coating 18 is itself effective to close corner seam 16 and thus prevent EMI/RFI leakage. However, the coating 18 may be subject to delamination and cracking should the walls 12 and 14 of the room move relative to one another. If any such cracking or delamination occurs along the corner seam 16, the integrity of the EMI/RFI shielding may be may be compromised. The corner seams 16 are particularly susceptible to cracking. Because there is typically no underlying wall (i.e. there may be a gap 17) to block electromagnetic and radio frequency waves, EMI and RFI, leakage can be expected if the corner seam 16 cracks or delaminations.

In preferred embodiments, the base coating 18 is zinc deposited on the walls 12 and 14 and corner seam 16 by known thermal arc-spraying methods. The invention is not, however, limited to such arc-sprayed zinc. Other methods of deposition can be used as well as other conductive materials.

The conductive screen 20 is formed to the desired shape and is layered over base coating 18 on the corner seam 16. The screen 20 should extend along the length of the corner seam 16 and laterally a selected distance X along both walls 12 and 14. It is not necessary that the length X for each wall 12 and 14 be the same. The distance X is selected to be sufficient so that delamination of the screen 20 will not occur should there be relative motion between the walls 12 and 14. In practice, the distance X may be approximately two inches or more.

In a preferred embodiment, the screen 20 is formed from copper wire and has a selected mesh size which is sufficiently fine or small to effectively shield RFI and EMI. In particular the mesh size is such that EMI/RFI is blocked in the region where cracking or delamination of the coatings 18 and 22 is most likely to occur as in the case where there is relative wall movement. Such a region is represented by some length D extending from the corner seam 16 in FIG. 1 or the junction 28 in FIG. 2. Ordinarily, the anticipated length D is shorter than the distance X.

In order to more securely bond the screen 20 to the corner 16 and to provide a smooth exterior surface, in a preferred embodiment an over coat 22 of conductive material is deposited over the screen 20. The overcoat 22 seeps through the openings in the screen 20 to firmly bond the screen 20 to the base coating 18 and to maintain electrical conductivity between the surface 13 and 15. Whereas the mesh size of the screen 20 should be sufficient to block EMI/RFI, it should also be large enough to allow adequate bonding of the screen 20 to the base coating 18.

The base coat 18 and over coat 22 preferably extend along the walls 12 and 14 beyond the length X of the screen 20 a distance sufficient to prevent peeling of the outer edges of the screen 20 from the walls 12 and 14. The over coat 22 is preferably zinc and is deposited by an arc-spraying method. The over coat, however, may be of any material sufficient to provide enhanced RFI and EMI shielding and may be deposited by any known methods.

The screen 10, when positioned, effectively provides continuous EMI/RFI shielding across joints and in regions where cracking or delamination of the walls 12-14 may occur. The shield 10 is also physically strong due to its multilayer construction. The screen layer 20 is relatively resistant to tearing in the presence of the shear and tensile forces that may occur when the walls 12-14 move relative to one another. Should such movement result in a crack in either or both of the conductive coatings 18 and 22, the intermediate screen layer 20 is sufficient to maintain the EMI/RFI shielding integrity of the shield 10.

The shield 10 has thus far been described as including a base conductive coating 18. This base coating 18, however, may not always be necessary. For instance, the screen 20 and over coat 22 alone may be sufficient to bond to a particular underlying substrate.

Figure 2:
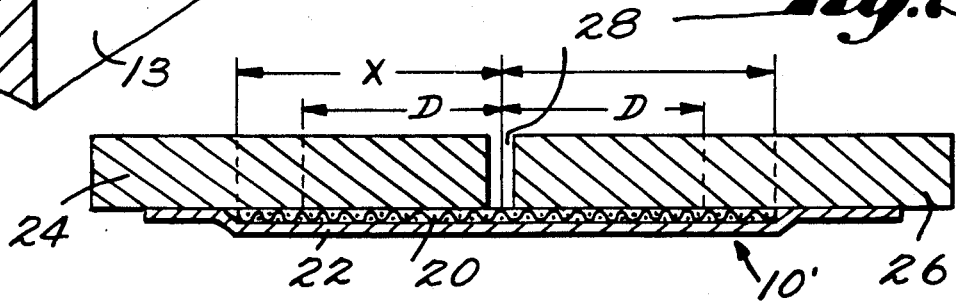
FIG. 2 illustrates a sectional view of another embodiment of the invention applied to a crack or seam formed between adjoining walls.

FIG. 2 illustrates such an embodiment of the shield 10' of the present invention wherein the base coating 18 (FIG. 1) is omitted. Conductive screen 20 is directly applied over the junction 28 of two walls 24 and 26 and is bonded firmly into position by over coat 22. The screen 20 preferably extends a distance X from the seam 28 sufficient to prevent delamination of the screen 20 if the walls 24 and 26 move with respect to each other. Furthermore, the mesh size of the screen should be sized satisfactorily to block EMI/RFI in the regions D laterally of the seam 28 where cracking or delamination may be anticipated.

Figure 3:
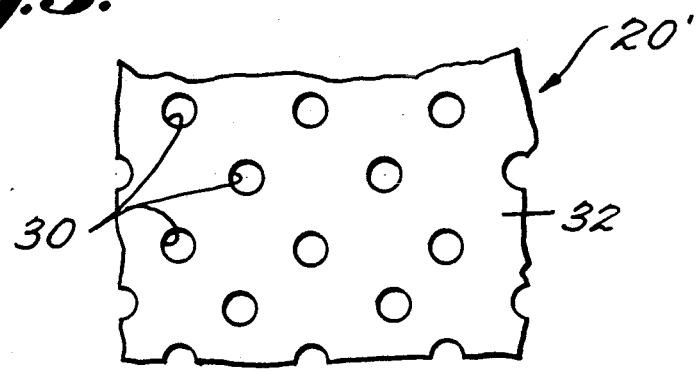
FIG. 3 is a fragmented plan view of a mesh shielding layer in the form of a perforated metal sheet.
Figure 4:
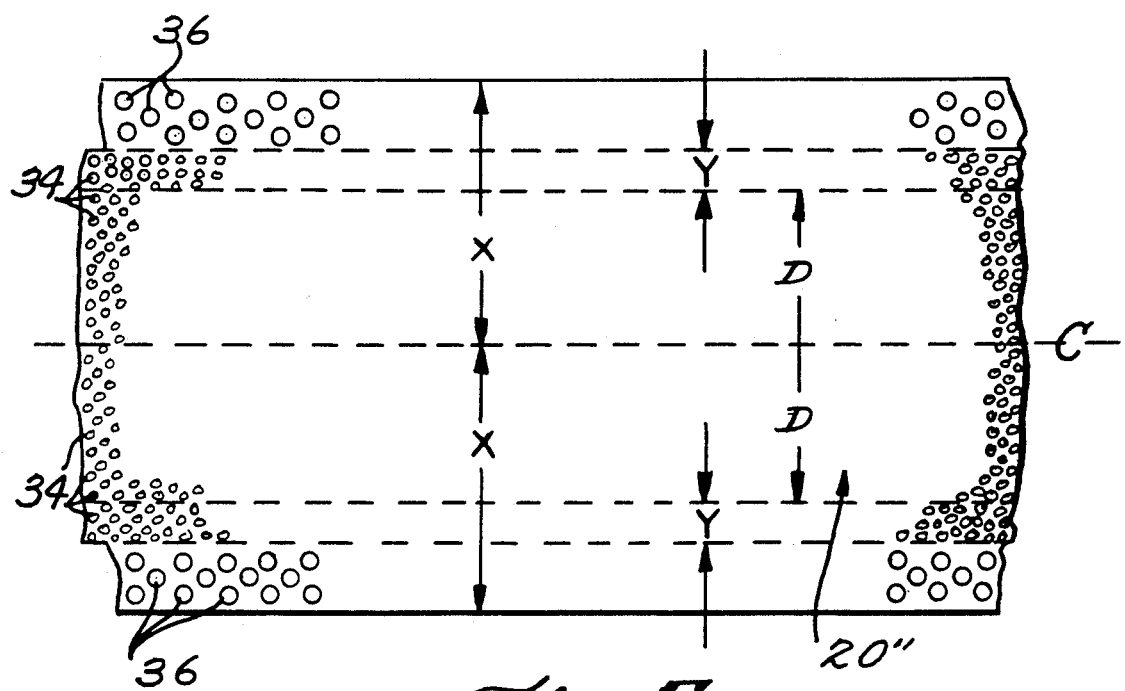
FIG. 4 is a fragmented plan view of a perforated mesh shielding layer similar to the arrangement of FIG. 3, wherein the perforations along the lateral edges of the sheet are larger than the perforations in the center area of the sheet.
Figure 5:
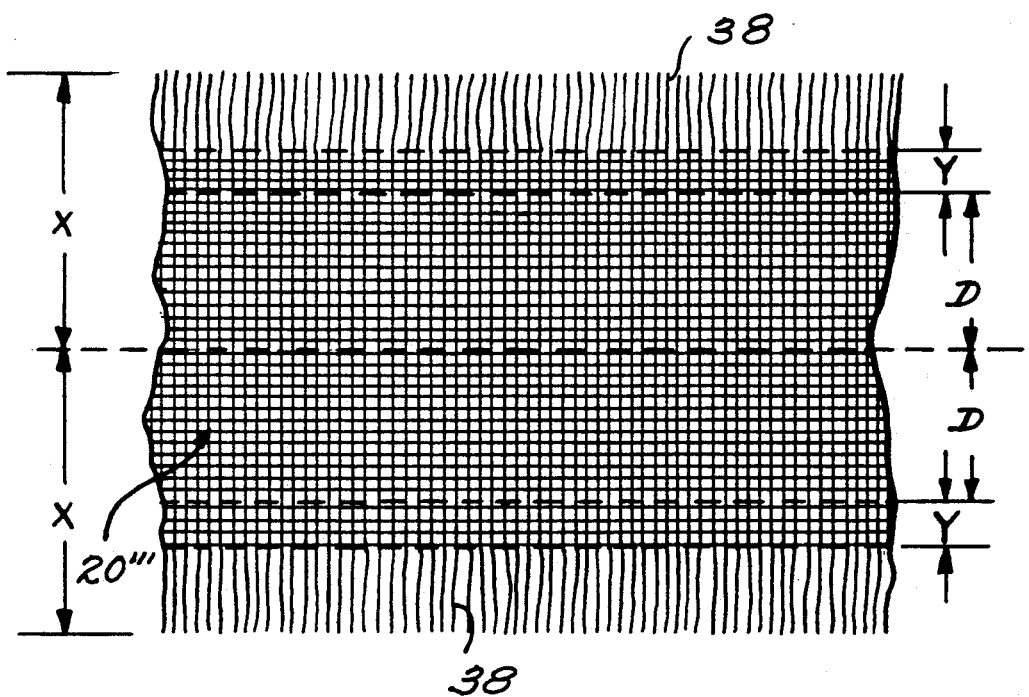
FIG. 5 is a fragmented plan view of a mesh shielding layer in the form of a wire screen with frayed lateral edges.

FIGS. 3-5 illustrate alternative embodiments of conductive screen 20. Referring to FIG. 3, screen 20' is formed by stamping perforations 30 into a metal foil 32. The foil 32 is preferably formed from copper but may be another conductive material. The holes 30 are preferably sufficiently large enough to allow bonding of the screen 20' to the base coating 18 or other underlying substrate, yet small enough to block EMI/RFI in the region D of interest.

In FIG. 4, the conductive screen 20" has different size holes 34 and 36. Dashed Line C represents a corner seam 16 (FIG. 1) or wall seam 26 (FIG. 2) or a crack line (not illustrated) to which the screen 20" is applied. Holes 34 adjacent the dashed Line C are sufficiently small to block EMI/RFI. The small holes 34 are distributed on either side of line C in the region D of anticipated delamination or cracking plus a certain error margin Y. Larger or coarser holes 36 are distributed on the outer edges of the screen 20" to improve the bonding of the screen 20" to the base coating 18 or other underlying substrate.

FIG.5 illustrates another conductive screen 20''' where the mesh size is varied. The mesh size of the screen 20''' is sufficiently fine to block EMI/RFI in the region D of anticipated delamination or cracking plus an error margin Y as measured from the center, as shown. The outer edges 38 of the screen 20''', however, are frayed to allow improved bonding of the screen 20'''.

While the invention has been described in connection with specific embodiments thereof, it will be understood that it is capable of further modifications. This application is intended to cover any variations, uses or adaptations of the invention following, in general, the principles of the invention, and including such departures from the present disclosure as come within known and customary practice within the art to which the invention pertains.

What is claimed is:

1. An EMI/RFI shield for maintaining electrical conductivity across a junction between electrically conductive surfaces comprising:
   a. a wire mesh, having frayed, marginal edges for enhancing bonding of the screen to the conductive surfaces, locatable across the junction in electrical contact with the conductive surfaces; and
   b. at least one over coat of electrically conductive material for deposition on and through the screen for physically bonding the screen to the conductive surfaces and for maintaining electrical contact between the screen and said surfaces.

2. The shield of claim 1, wherein the conductive over coat is formed from zinc.

* * * * *